United States Patent [19]
Liu et al.

[11] Patent Number: 5,925,915
[45] Date of Patent: Jul. 20, 1999

[54] SEMICONDUCTOR ON INSULATOR DEVICES

[75] Inventors: Michael S. Liu, Bloomington; James C. Lai, St. Paul, both of Minn.

[73] Assignee: Honeywell Inc., Minneapolis, Minn.

[21] Appl. No.: 08/251,011

[22] Filed: May 31, 1994

Related U.S. Application Data

[63] Continuation of application No. 07/997,864, Dec. 29, 1992, abandoned.
[51] Int. Cl.$^6$ .......................... H01L 27/01; H01L 27/12; H01L 29/76
[52] U.S. Cl. .......................... 257/351; 257/350; 257/403
[58] Field of Search ..................................... 257/351, 347, 257/348, 349, 350, 392, 402, 403, 404, 925, 639, 649, 352

[56] References Cited

U.S. PATENT DOCUMENTS 5,281,840   1/1994   Sarma ..................................... 257/352

FOREIGN PATENT DOCUMENTS 2-20060   1/1990   Japan ..................................... 257/350

OTHER PUBLICATIONS

Japanese Journal of Applied Physics, vol. 30, No. 12B, Dec., 1991, pp. 3710–3714, "Low–Temperature Operation of Polycrystalline Silicon Thin–Film Transistors" by Mori et al.

IEEE Electron Device Letters, vol. 12, No. 5, May 1991, p, 203–205, "Avalanche–Induced Effects in Polysilicon Thin–Film Transistors" by Hack et al.

Proceedings of the First Symposium on Thin Film Transistors Technologies, vol. 92–24, p, 45–58, "Physics of Amorphous and Poly–crystalline Silicon Thin Film Transistors" by Hack.

IEDM–82, "Novel SOI CMOS Design Using Ultra Thin Near Intrinsic Substrate", by Malhi et al., p,107–p, 110.

Appl. Phys. Lett. 52 (22), May 30, 1988, "Mass–dispersive recoil spectrometry studies of oxygen and nitrogen redistribution in ion–beam–synthesized buried oxynitride layers in silicon", by Whitlow et al., p, 1871–p, 1873.

"Properties of ESFI MOS Transistors Due to the Floating Substrate and the Finite Volume," J. Tihanyi et al, *IEEE Transitions on Electron Devices*, vol. Ed–22, No. 11, Nov. 1975, pp. 1017–1023.

"Improved Subthreshold Characteristics of n–Channel SOI Transistors," J. Davis et al, *IEEE Electron Device Letters*, vol. EDL–7, No. 10, Oct. 1986, pp. 570–572.

"Reduction of Kink Effect in Thin–Film SOI MOSFET's," J–P. Colinge, *IEEE Electron Device Letters*, vol. 9, No. 2, Feb. 1988, pp. 97–99.

"Dual–MOSFET Structure for Suppression of Kink in SOI MOSFET's at Room and Liquid Helium Temperatures," M–H Gao et al, Proceedings 1990, IEEE SOS/SOI Technology Conference, pp. 13–14.

*Primary Examiner*—Steven H. Loke
*Attorney, Agent, or Firm*—Gregory A. Bruns

[57] ABSTRACT

A pair of complementary MOSFET's having regions of a common conductivity type separating the source and drain regions thereof which are provided on a support structure formed of an electrical insulating layer on a semiconductor material base. MOSFET's has a gate oxide layer on which is provided a gate semiconductor structure, with these structures each being of a common conductivity type and located across the gate oxide layers from the corresponding common conductivity type region.

6 Claims, 3 Drawing Sheets

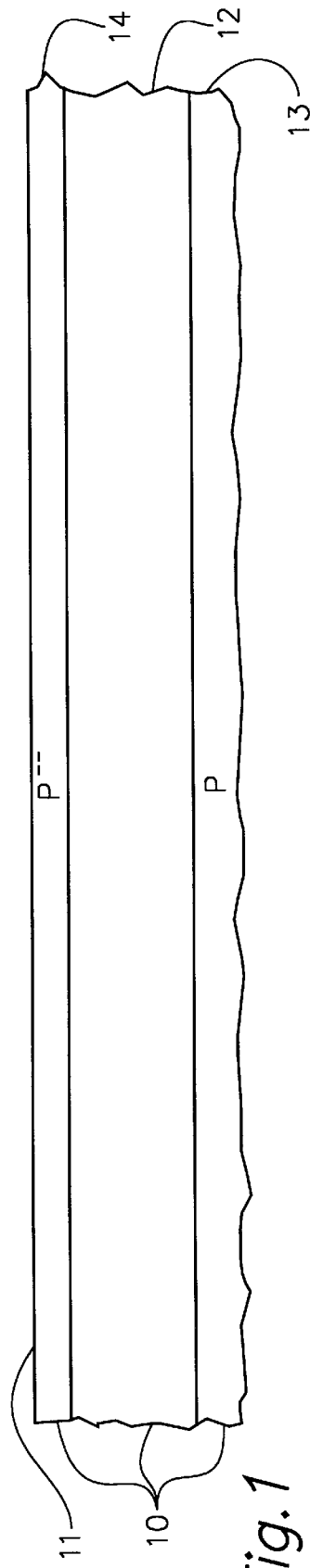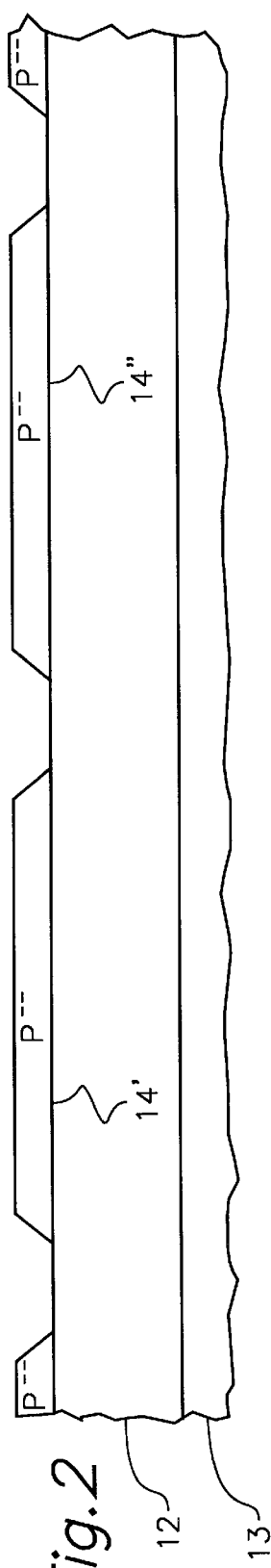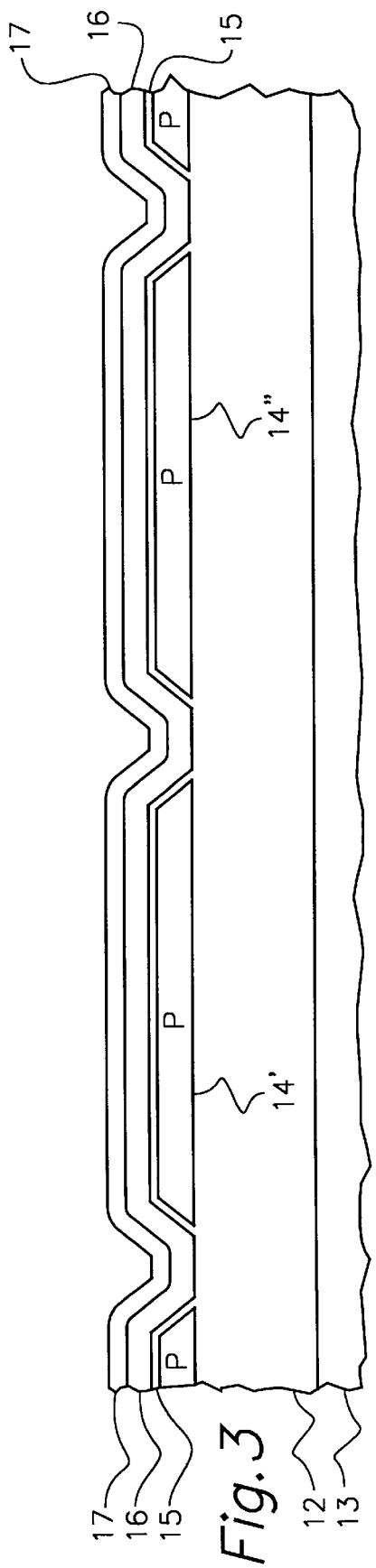

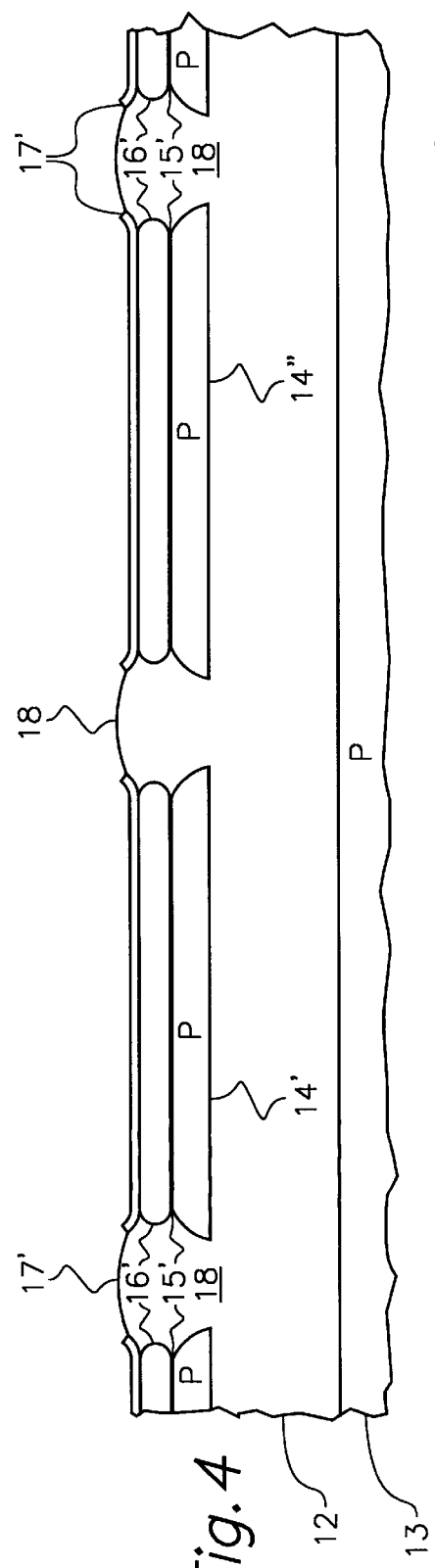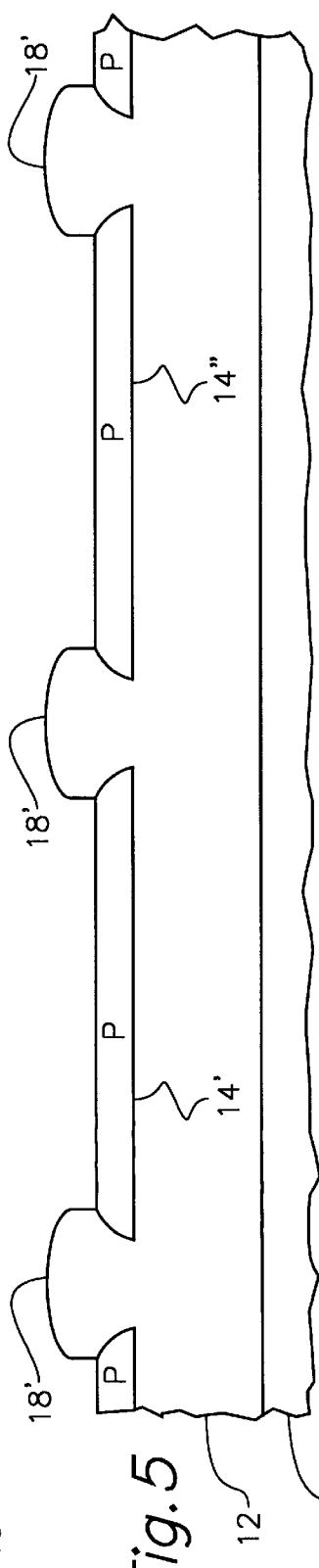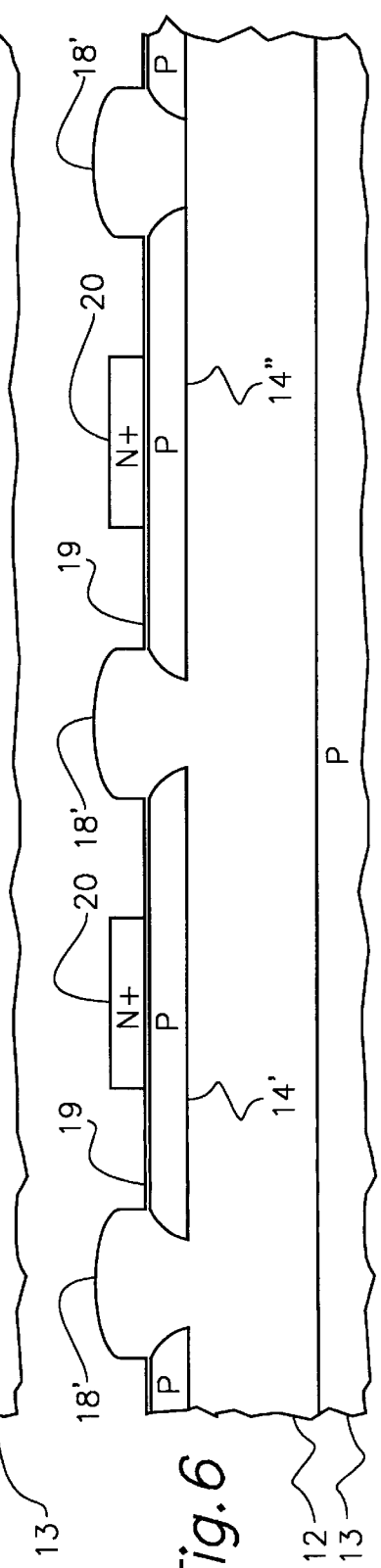

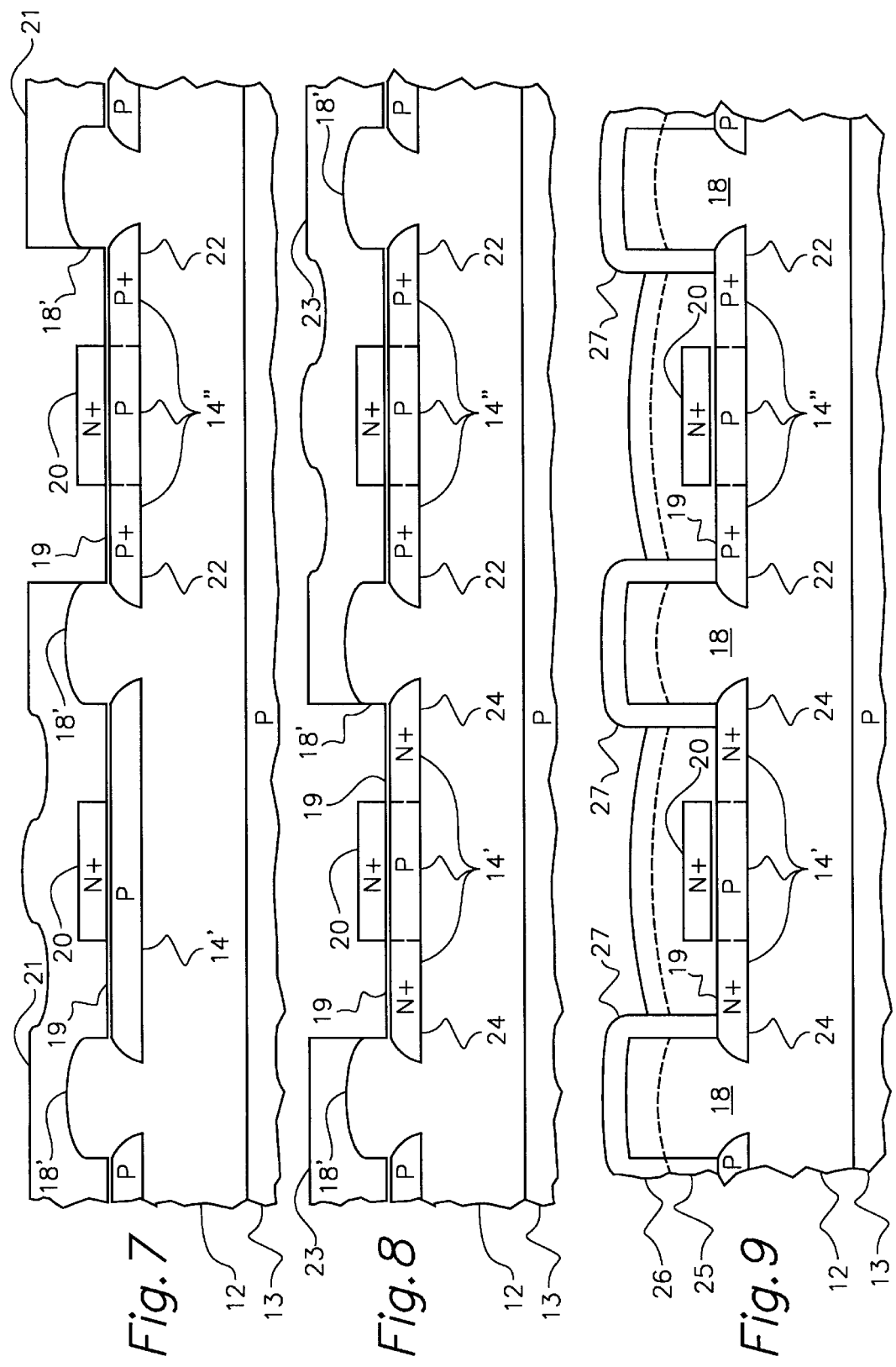

SEMICONDUCTOR ON INSULATOR DEVICES

This is a continuation of application Ser. No. 07/997,864, filed Dec. 29, 1992, now abandoned.

BACKGROUND OF THE INVENTION

The present invention relates to monolithic integrated circuits formed with active devices provided on an insulator and, more particularly, to complementary active devices formed on an insulator.

The use of a dielectric layer, particularly a silicon dioxide layer, has become common recently for electrically isolating a plurality of semiconductor material substrates provided thereon, to be used in forming circuit devices, from the remaining semiconductor material on which such a dielectric layer is provided. Thick field oxide is typically further provided between the semiconductor material substrates to also electrically isolate them from one another. Reduced parasitic capacitances result with respect to circuit devices in such a silicon-on-insulator (SOI) structures as compared to those resulting with respect to circuit devices formed in and on the surface of a single semiconductor material body as has been more typically done heretofore in monolithic integrated circuits, i.e. bulk semiconductor material monolithic integrated circuits. As a result, such SOI circuit devices so isolated can operate at higher rates than those in bulk semiconductor material monolithic integrated circuits.

The active circuit devices most commonly formed in such SOI semiconductor material substrates are insulated gate field-effect transistors or, more usually, metal-oxide-silicon field-effect transistors (MOSFET's). The presence of a limited volume of silicon material typically used to form each of such semiconductor material substrates in which MOSFET's are fabricated, and the absence of any electrical contact thereto in the channel region beneath the gate, can give rise to some unusual effects in those MOSFET's including (a) the "kink" effect involving sharp changes in the saturation region characteristics over a small change in the drain-to-source voltage applied thereto, (b) the anomalous subthreshold effect involving the gate voltage change required to reduce drain current in the subthreshold region, and (c) the "snapback" problem involving positive feedback which can cause a single MOSFET to latch at some operating point. The kink effect is undesirable in analog circuits in providing the possibility of unwanted current overshoots during operation.

The kink effect arises as the voltage between the drain and source is increased so that avalanche breakdown can occur near the drain. The resulting electrons move into the drain as do the electrons in the drain current, but the holes which result from impact ionization in the high-electric field region near the drain move into the substrate to accumulate sufficiently to forward bias the substrate-source junction. This causes the threshold voltage of the device to be reduced and the drain current to jump to a higher level. The kink effect is known to be avoidable by forming a MOSFET device having a channel region which is fully depleted of charge carriers.

At extremely cold temperatures, MOSFET's formed in bulk monolithic integrated circuits can behave very much like MOSFET's in silicon-on-insulator structures because they experience "carrier freeze-out" in which hole and electron generation becomes so low that there is effectively no current flow between the channel region and portions deeper in the semiconductor material substrate, i.e. the channel region is effectively electrically disconnected from the rest of the substrate. The structure remains highly resistive until the critical field from impurity ionization is exceeded, i.e. breakdown. The free carriers will be generated by contact barrier, impurity, or band to bands breakdown by the lateral electrical field (essentially drain fields). The impact ionization will occur in the higher electrical field in the pinch-off region to cause holes to flow into the substrate and accumulate in source-substrate junction regions at cryogenic temperatures. As a result, known MOSFET structures in bulk monolithic integrated circuits often exhibit the kink effect at sufficiently low temperatures, temperatures on the order of tens of degrees Kelvin.

Because depleting the channel region of such devices in bulk monolithic integrated circuits cannot be accomplished, or reliably accomplished at cold temperatures, there is a strong incentive to use MOSFET's formed in SOI monolithic integrated circuits. A further consideration is the forming of complementary MOSFET's (forming both n-channel and p-channel devices together) so that complementary MOSFET circuitry (CMOS) can be used in such SOI monolithic integrated circuits. Such circuitry has the desirable characteristics of consuming low power, having large noise margins, and lower radiation sensitivity. Thus, there is a desire to form complementary MOSFET's in silicon-on-insulator circuitry which avoid the kink effect, are relatively radiation hard, and relatively economical to fabricate.

SUMMARY OF THE INVENTION

The present invention provides a pair of complementary MOSFET's having regions of a common conductivity type, separating the source and drain regions thereof, which are depleted of charge carriers at cold temperatures.

BRIEF DESCRIPTION OF THE DRAWINGS

FIGS. 1 through 9 show in cross sectional form the results of steps in a method for fabricating complementary MOSFET's in a monolithic integrated circuit.

DETAILED DESCRIPTION OF THE PREFERRED EMBODIMENTS

FIGS. 1 through 9 show in cross section view the results of steps of the method of the present invention for providing the semiconductor device of the present invention. These figures are not to scale, and are not in proportion, for purposes of clarity.

FIG. 1 shows the results of providing an electrically insulative layer in a semiconductor material wafer, 10, beneath a major surface, 11, thereof, just a portion of wafer 10 and the resultant insulator therein being shown. A semiconductor material slice, or wafer, is the starting material substrate having a major surface in a (100) plane of the crystal structure. This wafer is doped with boron atoms to a concentration of $10^{15}$ atoms/cm$^3$ to give it a p-type conductivity. Oxygen ions, O$^+$ ions, are implanted through surface 11 in a dose of $1.8 \cdot 10^{18}$ ions/cm$^2$ with an implantation energy of 200 keV during which the substrate is maintained at a temperature of 600° C. to keep lattice damage low. The implantation results in the distribution of oxygen atoms in significant density at 2,000 Å below major surface 11 with this significant density extending over 4,000 Å from this starting point 2,000 Å below surface 11. Thereafter, the implanted wafer is annealed for around five hours at typically 1325° C. in a nitrogen atmosphere with 1% oxygen provided therein to prevent pitting of the surface.

The result is to provide an electrically insulative layer, 12, formed primarily of silicon dioxide but with portions toward the upper side thereof comprising oxynitride resulting in an increase in the radiation hardness of the devices to be formed thereon. The portion, 13, of substrate 10 below electrically insulative layer 12 continues to be boron doped with a concentration of boron atoms therein of $10^{15}$ atoms/cm$^3$ as before. However, the portion of wafer 10 above insulative layer 12 in FIG. 1 also remains doped with boron atoms to be a p-type conductivity material but with a concentration therein of less than $10^{15}$ atoms/cm$^3$ because of the leaching out of boron atoms during the annealing process.

The resulting wafer shown in FIG. 1 is then heated in a wet oxygen atmosphere at 900° C. to thermally grow 2,000 Å of silicon dioxide on surface 11. This growth of silicon dioxide will consume 860 Å of silicon adjacent to the exposed surface thereof, to thereby leave about 1,150 Å of semiconductor material below that silicon dioxide and above electrically insulative layer 12. This grown oxide structure is then wet etched with hyrdofluoric acid to remove the silicon dioxide with the remaining portions of the silicon therebelow serving as an etch stop. Thus, a thinned silicon layer, 14, of $p^{--}$ conductivity remains on electrically insulative layer 12, the thickness of this resulting layer being an important consideration in setting the operation mode of the active devices to be provided in and on that layer. The provision of insulative layer 12, and the provision of thinned semiconductor material layer 14 thereon of $p^{--}$-type conductivity, must be accomplished so as to result in an effective positive surface charge density at the interface between layer 12 and the thinned $p^{--}$-type conductivity silicon layer equivalent in magnitude to an effective electronic surface charge density (thus often termed a "positive electronic surface charge density") that is less than $3 \cdot 10^{11}$ cm$^{-2}$. Greater surface charge densities at this interface can lead to the effective surface state charge, including the fixed oxide charges contributing thereto, having an unwanted effect on the threshold voltage of the MOSFET's to be provided in subsequent steps as will be described below.

Such active devices, and possibly other devices, are to be formed in separated silicon substrates formed from thinned layer 14 of $p^{--}$-type conductivity silicon remaining on electrically insulative layer 12 after the requisite separating step, i.e. "islands" of silicon are to be formed on layer 12. Layer 14 is covered with a photoresist layer with portions thereof removed in a selected pattern, i.e. "patterned", in a well known manner to expose those locations of layer 14 selected to be those from which silicon is to be subsequently removed from that layer for purposes of separating the layer into individual substrates or "islands" separated and electrically isolated from one another. A well known plasma etching step is then performed to remove the silicon exposed between the now present "islands" of photoresist remaining over the intended "islands" of silicon to thereby form these substrates of silicon on layer 12.

The result of these silicon substrate forming steps is shown in FIG. 2 where the remaining photoresist has also been removed. In that figure, a cross section view of two of the resulting $p^{--}$ conductivity type silicon substrates, 14' and 14'', are shown. Portions of other such substrates to the left and right of these two can also be seen in that figure.

An implantation of boron ions into these resulting semiconductor material substrates is then made for purposes of adjusting the threshold voltage of the MOSFET's to be formed in and on those resulting semiconductor material substrates which will be p-channel MOSFET's. The implantation step is carried out with an energy of around 10.6 keV to give a dopant concentration in each of the semiconductor material substrates of about $2.5 \cdot 10^{16}$ atoms/cm$^3$. Thereafter, these semiconductor material substrates which are to have MOSFET's formed in them serving as p-channel MOSFET's are covered with a layer of photoresist, and a further ion implantation step is performed on those semiconductor material substrates remaining exposed to set the threshold voltages for the n-channel MOSFET's to be formed in and on them. Again, boron ions are implanted for this purpose with an energy of approximately 10.6 keV to give an atom concentration in those semiconductor material substrates of typically $5 \cdot 10^{16}$/cm$^3$. The doping in these semiconductor substrates to have MOSFET's formed therein is to remain less than $10^{17}$ atoms/cm$^3$ for the thickness chosen of the semiconductor material substrates if the MOSFET's to be formed therein are to be fully depleted of charge carriers in the channel regions thereof at appropriate temperatures as will be further described below. The result of these implantation steps will be to convert the $p^{--}$ conductivity type indication for the semiconductor material substrates formed on the surface of layer 12 to being generally designated as being of p-type conductivity at least until further doping of selected portions thereof.

After completing the MOSFET's threshold voltage adjustment implantations, the field oxide used to provide an electrical insulative barrier between the semiconductor material substrates is then provided. An initial thermally grown oxide layer, 15, is provided with a thickness of typically 150 Å, but less than 200 Å, as shown in FIG. 3 through heating the structure resulting from the threshold adjustment implants in a wet oxygen atmosphere at 900° C. An undoped polycrystalline silicon, or polysilicon, layer, 16, is then provided to a thickness of typically 2,600 Å through a well known low-pressure chemical vapor deposition process. This is followed by providing a silicon nitride layer, 17, with a thickness of 1,500 Å again using a well known low-pressure chemical vapor deposition process. The result is shown in FIG. 3.

A photoresist layer is then deposited and patterned using a well known method to expose those portions of nitride layer 17 located over the selected field regions between the semiconductor material substrates including substrates 14' and 14''. In a well known manner, plasma etching is used to remove the exposed portions of layer 17. After removing the remaining photoresist, the result is placed in a wet oxygen atmosphere at 900° C. to thermally grow the field oxide. An oxide growth is undertaken during which the exposed polysilicon in layer 16 is consumed so that there is a resulting silicon dioxide structure, 18, extending from the surface of electrically insulative layer 12 at the desired field locations upward to and past the remnants of layer 17. Thus, structures 18 may extend 6,000 Å above layer 12. The remnants of oxide layer 15, polysilicon layer 16 and silicon nitride layer 17 over the semiconductor material substrates are redesignated 15', 16' and 17', respectively, in the result shown in FIG. 4.

Thereafter, silicon nitride remnants 17' are removed by etching with hot sulfuric acid. This is followed by a plasma etch to remove polysilicon remnant 16' and oxide remnant 15' to thereby expose the upper surfaces of semiconductor material substrates including substrates 14' and 14''. The result can be seen in FIG. 5. Of course, some of the field oxide in structures 18 is also removed during such etching to result in a field oxide structure depth of approximately 3,000 Å to electrically insulative layer 12, the field oxide structures having been redesignated as a result in FIG. 5 to now be marked 18'.

A gate oxide layer, 19, typically 150 Å thick, but less than 200 Å thick, is then thermally grown by placing the result shown in FIG. 5 in a wet oxygen atmosphere at 900° C. This is followed by depositing a layer of undoped polysilicon using a well known low-pressure chemical vapor deposition method to a depth of 3,500 Å on gate oxide layer 19 and over field oxide structures 18'. This polysilicon layer is then doped with phosphorous to give a resulting concentration of typically $10^{20}$ atoms/cm$^3$. The deposition is accomplished using a well known phosphorous oxychloride diffusion process. Thereafter, a layer of photoresist is deposited on the doped polysilicon layer and patterned to expose those areas not involved either with forming gates on MOSFET devices or with the interconnection portions extending from those gates to other locations in the monolithic integrated circuit intended to be electrically interconnected with such gates. The exposed portions of the doped polysilicon layer are thereafter etched away in a well known plasma etching step to leave only the gate structures for MOSFET's along with the interconnections extending therefrom to other interconnected locations as provided by the remaining doped polysilicon layer portions, 20, which are shown in FIG. 6.

A layer of photoresist is then provided over the result shown in FIG. 6 and patterned in a well known manner to leave a mask, 21, over substantial portions of that result but exposing those gate oxide layers and gates that are over semiconductor material substrates in and on which p-channel type MOSFET's are to be formed, such as semiconductor material structure 14". An implantation of boron ions to form self-aligned source and drain regions for such p-channel MOSFET devices is then performed through corresponding gate oxide layers 19 at an energy 10 keV using a dose of $3 \cdot 10^{15}$ cm$^{-2}$. The resulting sources and drains, or MOSFET terminating regions, 22, are shown marked as having a resulting p$^+$-type conductivity in FIG. 7.

Photoresist mask 21 is then removed and a layer of photoresist is again deposited and patterned in a well known manner to leave a further mask, 23, exposing those gates and gate oxides that are over semiconductor material substrates in and on which n-channel MOSFET's are to be formed. An implantation of phosphorous ions to form self-aligned source and drain regions for these n-channel MOSFET's is then performed through corresponding gate oxide layers 19 at an energy of 30 keV with a dose of $2 \cdot 10^{15}$ cm$^{-2}$. The sources and drains, or MOSFET terminating regions, 24, are marked to show them having n$^+$-type conductivity in FIG. 8.

Photoresist mask 23 is then removed and the device is annealed at 925° C. for 15 to 30 minutes to reduce the lattice damage due to the ion implantations used to form the source and drain regions. The gate oxide layers 19, as they remain, should achieve an effective electronic charge density at the interface thereof with the semiconductor material substrates therebelow which is less than $5 \cdot 10^{10}$ cm$^{-2}$ electronic charges due to both the fixed charges in these gate oxide layers and the charge in surface states at the interface. This limit is to again assure that this charge does not substantially affect the threshold voltages of the MOSFET's being obtained by the fabrication process.

Thereafter, silicon dioxide is deposited in a well known chemical vapor deposition step to form a layer, 25, with a depth of 3,500 Å, followed by a further deposition of silicon dioxide doped with phosphorous to form a phosphosilicate glass layer, 26, with a depth of 1,000 Å. This is followed by a densification step carried out at 800° C. for one hour in preparation for contact cut and metallization. A layer of photoresist is deposited and patterned exposing locations where via openings are to be made to accept metallization interconnections, and thereafter metallization is provided to make the interconnections, 27, as shown in FIG. 9. Following this, a passivation layer would typically be provided, but which will not be illustrated here.

As can be seen in FIG. 9, the channel region for each of the resulting MOSFET's fabricated in and on semiconductor material substrates 14' and 14" is of p-type conductivity even though the MOSFET associated with substrate 14' is intended to be an n-channel MOSFET and the MOSFET associated with substrate 14" is intended to be a p-channel MOSFET. There are substantial fabrication process difficulties in consistently fabricating semiconductor material substrates 14' and 14" to be sufficiently thin, lightly enough doped and have the charges in the gate oxide such that the MOSFET's made therein have the channel regions fully depleted of charge carriers with the gate and source at a zero potential difference. As a result, the devices shown in FIG. 9 at room temperature will typically have the n-channel device operating in the enhancement mode and the p-channel device operating in the depletion mode, and subthreshold current flows will be possible therethrough.

However, as the operating environment for the device of FIG. 9 becomes sufficiently cold so that the MOSFET devices therein begin to experience charge carrier freeze-out due to decreased hole and electron generation, the thickness of semiconductor material substrates 14' and 14", the doping level therein and the gate oxides are such that the p-type conductivity regions therein will become fully depleted of charge carriers at some point below 100° K but above 10° K. Thus, operation at extremely cold temperatures allows for greater thicknesses and greater variation in the doping of semiconductor material substrates 14' and 14" such that they can be consistently made during fabrication to assure they will be fully depleted devices, and so free of the "kink" effect.

Hence, n-channel and p-channel MOSFET's can be made as described above which will be fully depleted at least at some temperature on an electrically insulative layer such that the n-channel device will then operate in the enhancement mode and the p-channel device will operate in the accumulation mode, the latter accumulating charge beneath its gate oxide to provide a channel between the terminating regions on either side thereof despite the channel region being otherwise depleted of charge carriers. The fully depleted region of the semiconductor material substrate below this channel will make it immaterial as to what conductivity type it has. Because of the fully depleted condition of the devices during operation, the charge density at the inner face between electrically insulative layer 12 and semiconductor material substrates 14' and 14" is important since there will not be any charge carriers to screen the effects of this interface charge density. So, if the interface charge density is sufficiently great, the threshold voltage of the MOSFET's would be affected thereby in this operating condition.

The threshold voltage of devices fabricated as described above is approximately ±0.4 volts at room temperature, but approximately ±0.8 volts at extremely cold temperatures. Thus, these devices, becoming fully depleted at sufficiently cold temperatures and exhibiting a desirable threshold voltages at those temperatures, can be seen to be MOSFET's formed in a monolithic integrated circuit well suited for harsh environments such as those of outer space, particularly in view of the relatively good radiation hardness exhibited thereby.

Although the present invention has been described with reference to preferred embodiments, workers skilled in the art will recognize that changes may be made in form and detail without departing from the spirit and scope of the invention.

What is claimed is:

1. A semiconductor device comprising:
   a support structure formed of an electrically insulating layer on a semiconductor material base of a first conductivity type;
   a plurality of field-effect transistors including first and second field-effect transistors comprising:
   first and second semiconductor material substrates for said first and second field-effect transistors, respectively, that are substantially crystalline and provided spaced apart from one another on said electrically insulating layer with each having a central portion thereof of said first conductivity type, said first semiconductor material substrate having a pair of terminating regions of said first conductivity type separated by said central portion thereof each having a greater conductivity than said central portion, said second semiconductor material substrate having a pair of terminating regions of a second conductivity type separated by said central portion thereof;
   first and second gate oxide layers provided on at least said first and second semiconductor material substrate central portions, respectively having less than $5 \cdot 10^{10}$ cm$^{-2}$ electronic charges due both to fixed charges in said first and second gate oxide layers and to interface charge occurring at corresponding interfaces between each of said first and second gate oxide layers and corresponding said first and second semiconductor material substrate central portions, and
   first and second gate semiconductor structures of a common conductivity type provided on said first and second gate oxide layers across from said first and second semiconductor material substrate central portions, respectively.

2. A semiconductor device comprising:
   a support structure formed of an electrically insulating layer on a semiconductor material base of a first conductivity type;
   a plurality of field-effect transistors including first and second field-effect transistors comprising:
   first and second semiconductor material substrates for said first and second field-effect transistors, respectively, that are substantially crystalline and provided spaced apart from one another on said electrically insulating layer with each having a central portion thereof of said first conductivity type as provided on said support structure so as to have at corresponding interfaces therebetween a positive electronic surface charge density which is less than $3 \cdot 10^{11}$ cm$^{-2}$, said first semiconductor material substrate having a pair of terminating regions of said first conductivity type separated by said central portion thereof each having a greater conductivity than said central portion, said second semiconductor material substrate having a pair of terminating regions of a second conductivity type separated by said central portion thereof;
   first and second gate oxide layers provided on at least said first and second semiconductor material substrate central portions, respectively; and
   first and second gate semiconductor structures of a common conductivity type provided on said first and second gate oxide layers across from said first and second semiconductor material substrate central portions, respectively.

3. The device of claim 2 wherein said first and second gate oxide layers as provided on respective ones of said first and second semiconductor material substrate central portions have less than $5 \cdot 10^{10}$ cm$^{-2}$ electronic charges due both to fixed charges in said first and second gate oxide layers and to interface charge occurring at corresponding interfaces between each of said first and second gate oxide layers and corresponding said first and second semiconductor material substrate central portions.

4. A semiconductor device comprising:
   a support structure formed of an electrically insulating layer on a semiconductor material base of a first conductivity type;
   a plurality of field-effect transistors including first and second field-effect transistors comprising:
   first and second semiconductor material substrates for said first and second field-effect transistors, respectively, that are substantially crystalline and provided spaced apart from one another on said electrically insulating layer with each having a central portion thereof of said first conductivity type, said first semiconductor material substrate having a pair of terminating regions of said first conductivity type separated by said central portion thereof each having a greater conductivity than said central portion, said second semiconductor material substrate having a pair of terminating regions of a second conductivity type separated by said central portion thereof;
   first and second gate oxide layers, each less than 200 Å thick, provided on at least said first and second semiconductor material substrate central portions, respectively, having less than $5 \cdot 10^{10}$ cm$^{-2}$ electronic charges due both to fixed charges in said first and second gate oxide layers and to interface charge occurring at corresponding interfaces between each of said first and second gate oxide layers and corresponding said first and second semiconductor material substrate central portions, and
   first and second gate semiconductor structures of a common conductivity type provided on said first and second gate oxide layers across from said first and second semiconductor material substrate central portions, respectively.

5. The device of claim 4 wherein said first and second semiconductor material substrate central portions as provided on said support structure each have at corresponding interfaces therebetween a positive electronic surface charge density which is less than $3 \cdot 10^{11}$ cm$^{-2}$.

6. A semiconductor device comprising:
   a support structure formed of an electrically insulating layer on a semiconductor material base of a first conductivity type;
   a plurality of field-effect transistors including first and second field-effect transistors comprising:
   first and second semiconductor material substrates for said first and second field-effect transistors, respectively, that are substantially crystalline and provided spaced apart from one another on said electrically insulating layer with each having a central portion thereof of said first conductivity type as provided on said support structure so as to have at corresponding interfaces therebetween a positive electronic surface charge density which is less than $3 \cdot 10^{11} cm^{-2}$, said first semiconductor material substrate having a pair of terminating regions of said first conductivity type separated by said central portion thereof each having a greater conductivity than said central portion, said second semiconductor material substrate having a pair of terminating regions of a second conductivity type separated by said central portion thereof;

first and second gate oxide layers, each less than 200 Å thick, provided on at least said first and second semiconductor material substrate central portions, respectively; and first and second gate semiconductor structures of a common conductivity type provided on said first and second gate oxide layers across from said first and second semiconductor material substrate central portions, respectively.

* * * * *